United States Patent
Tsukude et al.

[11] Patent Number: 6,150,728
[45] Date of Patent: *Nov. 21, 2000

[54] SEMICONDUCTOR MEMORY DEVICE HAVING A PAD ARRANGEMENT WITH REDUCED OCCUPYING AREA

[75] Inventors: Masaki Tsukude; Kazutami Arimoto, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/854,754

[22] Filed: May 12, 1997

Related U.S. Application Data

[63] Continuation of application No. 08/609,321, Mar. 1, 1996, abandoned.

[30] Foreign Application Priority Data

May 12, 1995 [JP] Japan .................................. 7-114359

[51] Int. Cl.[7] ........................... H01L 23/48; H01L 23/52; H01L 29/40
[52] U.S. Cl. ........................ 257/786; 257/784; 257/782; 257/666
[58] Field of Search .................................... 257/784, 786, 257/782, 666; 438/123, 111; 361/813

[56] References Cited

U.S. PATENT DOCUMENTS

| | | | |
|---|---|---|---|
| H1267 | 12/1993 | Boyd | 257/700 |
| 4,930,000 | 5/1990 | Kantz | 257/786 |
| 5,126,286 | 6/1992 | Chance | 257/786 |
| 5,250,840 | 10/1993 | Oh et al. | 257/786 |
| 5,285,082 | 2/1994 | Axer | 257/786 |
| 5,457,340 | 10/1995 | Templeton, Jr. et al. | 257/782 |
| 5,545,920 | 8/1996 | Russell | 257/666 |
| 5,589,420 | 12/1996 | Russell | 438/123 |

FOREIGN PATENT DOCUMENTS

| | | | |
|---|---|---|---|
| 357112057 | 7/1982 | Japan | 257/697 |
| 362098752 | 5/1987 | Japan | 257/697 |
| 02 132 848 A | 5/1990 | Japan | . |
| 03 230 558 A | 10/1991 | Japan | . |
| 404152554 | 5/1992 | Japan | 257/697 |
| 404368175 | 12/1992 | Japan | 257/786 |
| 406005657 | 1/1994 | Japan | 257/697 |
| 06 302 644 A | 10/1994 | Japan | . |

*Primary Examiner*—Mahshid Saadat
*Assistant Examiner*—Jhihan B. Clark
*Attorney, Agent, or Firm*—McDermott, Will & Emery

[57] ABSTRACT

On a surface of a semiconductor chip having a longer side and a shorter side, a line of a plurality of first pads and a line of a plurality of second pads are arranged in the shape of a cross. Upon multibit expansion, increase in length of the longer side of semiconductor chip can be suppressed even though the number of pads is increased by additionally providing the second pad. In addition, there is no need to reduce the pitch between pads. Thus, a semiconductor memory device allowing multibit expansion is provided without an increase in size of the chip and the pad or reduction in pitches between pads and between pins.

19 Claims, 10 Drawing Sheets

SEMICONDUCTOR MEMORY DEVICE HAVING A PAD ARRANGEMENT WITH REDUCED OCCUPYING AREA

This application is a continuation of application Ser. No. 08/609,321 filed Mar. 1, 1996, now abandoned.

BACKGROUND OF THE INVENTION

1. Field of the Invention

The present invention relates to semiconductor memory devices and pad arranging methods thereof, and more particularly, to a pad arrangement capable of easily coping with an increase in the number of pin terminals.

2. Description of the Background Art

FIG. 11 shows an arrangement of pads and a lead frame of a conventional dynamic random access memory (DRAM). In FIG. 11, a required circuit is formed on a semiconductor chip CH having a rectangular shape with a longer side (a first side) and a shorter side (a second side). Although not clearly shown in FIG. 11, a memory cell array, an input/output buffer, and a control circuit are formed in the semiconductor memory device. A central region CR is formed to extend along the longer side at the central portion with respect to the shorter side of semiconductor chip CH. In central region CR, pads PD for making electrical connection to a chip outside are alignedly arranged in a line.

Lead frame FL is arranged for connecting to pads PD and extending to be external pin terminals. Generally, leads are supported by a frame (metal frame) in a lead frame, and lead portions are cut off from the frame after semiconductor chip CH is sealed with resin. Each lead portion will be referred to as a frame lead in the description made hereinafter. Each frame lead FL extends over semiconductor chip CH to the vicinity of central region CR, where it is connected with a corresponding pad PD through a bonding wire (not shown). After the bonding step is completed, the semiconductor memory device is sealed with resin and put in a package PA. Thereafter, the respective other ends of the frame leads are cut off from the frame and machined in accordance with the shape of pins of the pin arrangement of the package and they serve as external pin terminals.

The structure in which frame leads extend to the central portion of semiconductor chip CH as shown in FIG. 11 is called an LOC (Lead On Chip) structure. In the LOC structure, pads PD are arranged in central region CR of semiconductor chip CH. As compared with a commonly used structure of peripheral pad arrangement in which pads are arranged along the longer sides at both ends of the shorter side of the semiconductor chip CH, the area occupied by the pads can be reduced and therefore semiconductor chip CH is shortened in the direction of its shorter side in LOC structure.

Generally, development of semiconductor memory devices such as a DRAM begins with less bit products having a small bit width of data such as ×1 bit and ×4 bits. Based on the less bit product thus developed, development of multiple bit products such as ×8 bits and ×16 bits (referred to as multiple bit expansion) is carried out. Semiconductor memory devices are advanced to have more storage capacity, and a DRAM with a storage capacity of 256M bits or more is developed at present. For a DRAM with such a large storage capacity, multiple bit products of ×32 bits or more must be developed in accordance with the data width of an external processor (in accordance with the word length). In such a multiple bit product, the numbers of data input/output pins, address signal input pins and control signal input pins are increased in accordance with increase in the number of data bits and in storage capacity, and thus at least 80 pin terminals are necessary.

If pads PD are alignedly arranged in a line in central region CR as shown in FIG. 11 when at least 80 pin terminals are necessary, the longer side of semiconductor chip CH is increased in length because each pad corresponds with an external pin terminal. Therefore, in this case, the chip length (the length of the longer side of semiconductor chip CH) is determined by the pitch between pads PD (the distance between the central portions of pads) and the number of pads, not by the length of semiconductor chip CH required to form circuitry to be formed in semiconductor chip CH. As a result, if the pitch between pads PD cannot be reduced, the longer side of semiconductor chip CH becomes longer unnecessarily for only the disposal of pads PD, giving rise to a problem of an increase in size of the chip. The pitch between pads PD must be reduced in order to suppress such an increase in size of semiconductor chip CH. However, a novel technique which is completely different from a conventional one must be developed for this purpose, and it is difficult to reduce the pitch between pads PD at present.

If package PA of a semiconductor memory device is of an SOP (Small Outline Package) type or a TSOP (Thin Small Outline Package) type where lead pins are taken out only from the both longer sides of package PA as shown in FIG. 11 or of an SOJ (Small Outline J-leaded package) type, the length of the longer side of package PA is determined by the pitch between pin terminals (the portions of frame leads FL outside the package) and the number of pin terminals, not by the length of the longer side of semiconductor chip CH contained therein. Therefore, if the pitch between the pin terminals cannot be reduced, the package size is increased. For reduction of the pitch between the pin terminals, working accuracy and insulation characteristics of the leads, among others, must be considered, and there is a limit to such a reduction. A novel technique which is completely different from a conventional one is required to sufficiently reduce the pitch between the pin terminals without causing an increase in size of the package, which is difficult at present.

SUMMARY OF THE INVENTION

An object of the present invention is to provide a semiconductor memory device and a pad arrangement method allowing an easy increase in the number of pads without a significant increase in size of a chip upon multibit expansion.

Another object of the present invention is to provide a semiconductor memory device allowing an easy increase in the number of pin terminals without a significant increase in size of a package upon multibit expansion.

A semiconductor memory device according to a first aspect of the present invention includes a line of a plurality of first pads and a line of a plurality of second pads, which lines are arranged in the shape of a cross on a semiconductor chip.

A semiconductor memory device according to a second aspect of the present invention includes, on a rectangular semiconductor chip having first and second sides, a plurality of memory blocks alignedly arranged in each of the directions of the first and second sides, a plurality of first pads arranged in a first central region which is formed between the memory blocks alignedly arranged in the direction of the second side and extends in the direction of the first side, and a plurality of second pads arranged in a second central region which is formed between the memory blocks alignedly arranged in the direction of the first side and extends in the direction of the second side.

A semiconductor memory device according to a third aspect of the present invention includes a rectangular semiconductor chip which has first and second sides and on which at least a memory array is formed, a plurality of first pads arranged in a first central region which is formed at a central portion with respect to the direction of the second side and extends in the direction of the first side, and a plurality of second pads arranged at both end portions of the first side in the direction of the second side.

A pad arrangement method according to a fourth aspect of the present invention includes the step of arranging a plurality of pads in a first central region of a rectangular semiconductor chip, which region is located at a central portion with respect to the direction of a second side and extends in the direction of a first side, when data is input/output to/from a memory cell array on a basis of a first predetermined number of bits, and the step of additionally arranging a pad in a second central region, located at a central portion with respect to the direction of the first side and extending in the direction of the second side, when data is input/output to/from the memory cell array on a basis of a second predetermined number of bits greater than the first predetermined number.

In the semiconductor memory device according to the first aspect, the pads are arranged to form a cross on the semiconductor chip. In contrast to the arrangement where pads are arranged only in one direction, the pads are divided and arranged in two directions, so that an increase in length of one arranging direction of the pads can be suppressed and accordingly, an increase in length of the chip can be suppressed.

In the semiconductor memory device according to the second aspect, the pads are arranged in the region between the memory blocks. By arranging the pads between the memory blocks, a signal interconnection to each memory block can be shortened and an increase in the number of pads in one direction can be suppressed in multibit expansion, and therefore an increase in length of the chip can be suppressed.

In the semiconductor memory device according to the third aspect, the pads are grouped and arranged at both end portions with respect to the direction of the first side of the semiconductor chip and at the area of the central region in the direction of the first side. Accordingly, the pads are alignedly arranged equivalently in three lines, so that an increase in length in the pad arrangement direction is suppressed when the pads are increased in number, and therefore an increase in size of the chip can be suppressed, as compared with the arrangement where the pads are arranged in one line.

In the pad arrangement method according to the fourth aspect, the plurality of pads are arranged in the first central region of the chip when data is input/output on a unit of the first predetermined number of bits, and the pads are additionally arranged in the second central region upon multibit expansion in which data is input/output on a basis of the second predetermined number of bits greater than the first predetermined number. As a result, pads are arranged in the second central region different from the first central region even though the number of pads is increased upon multibit expansion, thereby suppressing an increase in length of the chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
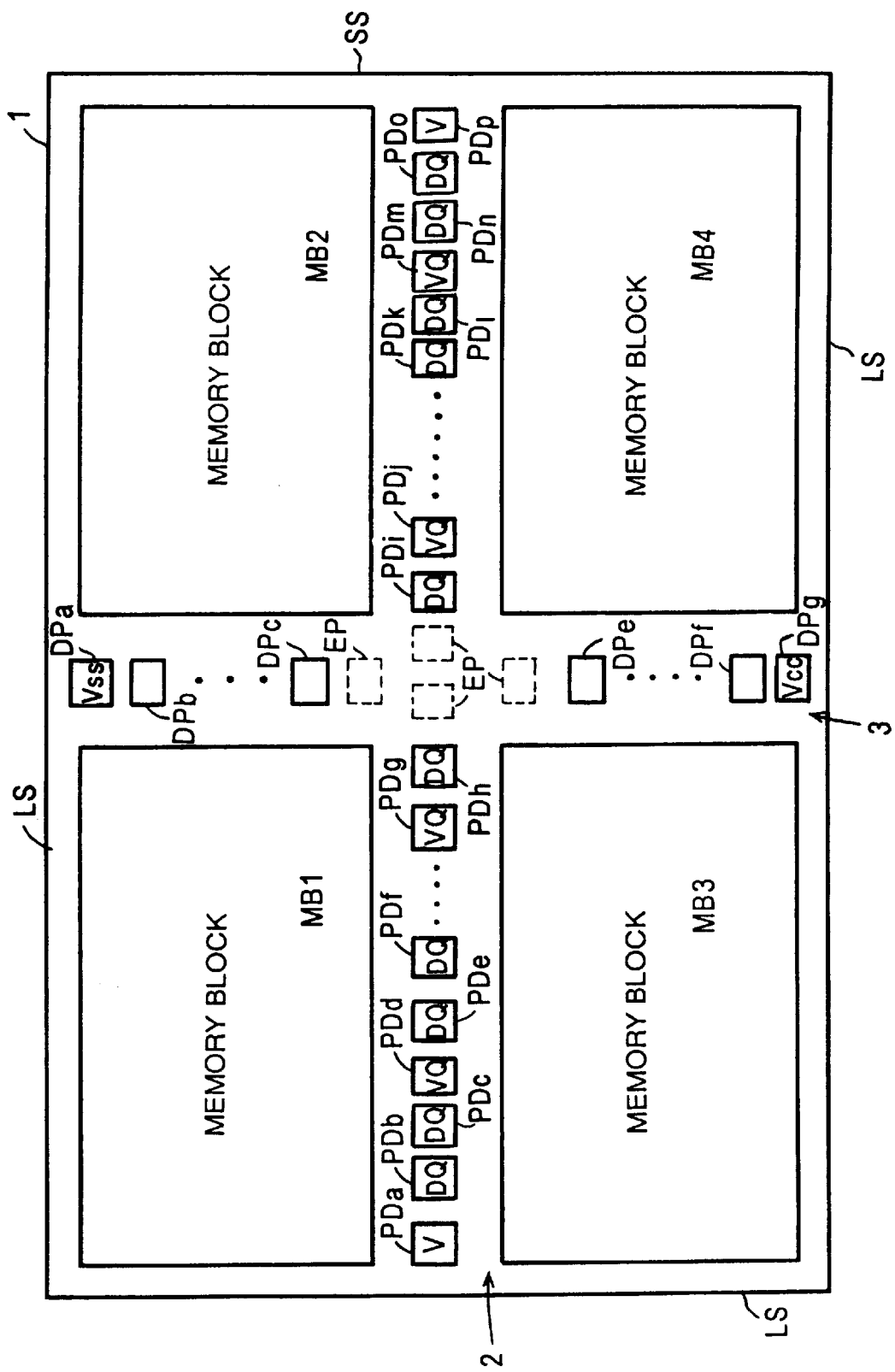
FIG. 1 shows an internal arrangement of a semiconductor memory device according to a first embodiment of the present invention.

FIG. 1 shows an internal pad arrangement of a semiconductor memory device according to a first embodiment of the present invention. Referring to FIG. 1, four memory blocks MB1–MB4 are arranged on a rectangular semiconductor chip 1 having a longer side LS as a first side and a shorter side SS as a second side. Memory blocks MB1 and MB2 are alignedly arranged in the direction of longer side LS of semiconductor chip 1 (the extending direction of the longer side in FIG. 1), while memory blocks MB3 and MB4 are arranged opposing to memory blocks MB1 and MB2 respectively, and alignedly arranged in the direction of the longer side LS. Memory blocks MB1 and MB3 are alignedly arranged in the direction of shorter side SS of semiconductor chip 1 (the direction in which shorter side SS extends), while memory blocks MB2 and MB4 are arranged opposing to memory blocks MB1 and MB3 and alignedly arranged in the direction of the shorter side.

A first central region 2 is provided to extend in a direction of the longer side between memory blocks MB1 and MB2 and memory blocks MB3 and MB4 which are alignedly arranged in the direction of the longer side, while a second central region 3 is formed to extend in the direction of the shorter side between memory blocks MB1 and MB3 and memory blocks MB2 and MB4.

In first central region 2, pads PDa–PDp are alignedly arranged in a line. In second central region 3, pads DPa–DPg are alignedly arranged in a line.

In first central region 2, pads PDa and PDp arranged at both ends thereof are power supply pad portions for receiving a power supply voltage Vcc and a ground voltage Vss applied externally and transmitting the received voltages to the inside. Pads PDb, PDc, PDe, PDf, PDh, PDi, PDk, PDl, PDn and Pdo are data input/output pads and used for input/output of data to/from the memory blocks arranged in the vicinity thereof. Pads PDd, Pdg, Pdj and Pdm provide power supply voltage Vcc and ground voltage Vss to data input/output buffers (arranged in the vicinity of data input/output pads). By arranging power supply pad portions between data input/output pads, operation power supply voltages Vcc and Vss can be stably supplied to each input/output buffer, so that input/output of data can be stably performed. A pad EP shown in the broken line in first central region 2 is an empty pad which is not used any longer as a result of multibit expansion.

In second central region 3, pad DPa arranged at one end thereof receives ground voltage Vss, while pad DPg arranged at the other end thereof receives power supply voltage Vcc. Pads DPb–DPc and DPe–DPf are used for receiving control signals (such as a chip enable signal and a write enable signal) and address signals. Empty pad EP is arranged also in second central region 3.

In arranging the pads, data input/output pads are preferentially arranged in first central region 2, while the pads for receiving a clock signal and an address signal are preferentially arranged in the second central region. When a semiconductor memory device is developed as a base in which only the pads alignedly arranged in a line in first central region 2 are used, the pad pitch of the base chip 5 (the semiconductor device used as a starting product with which development is initiated) can be maintained even in the multibit expansion chip, a significant increase in length of longer side LS of the semiconductor chip 1 can be suppressed by arranging pads in the second central region upon the multibit expansion.

Figure 2:
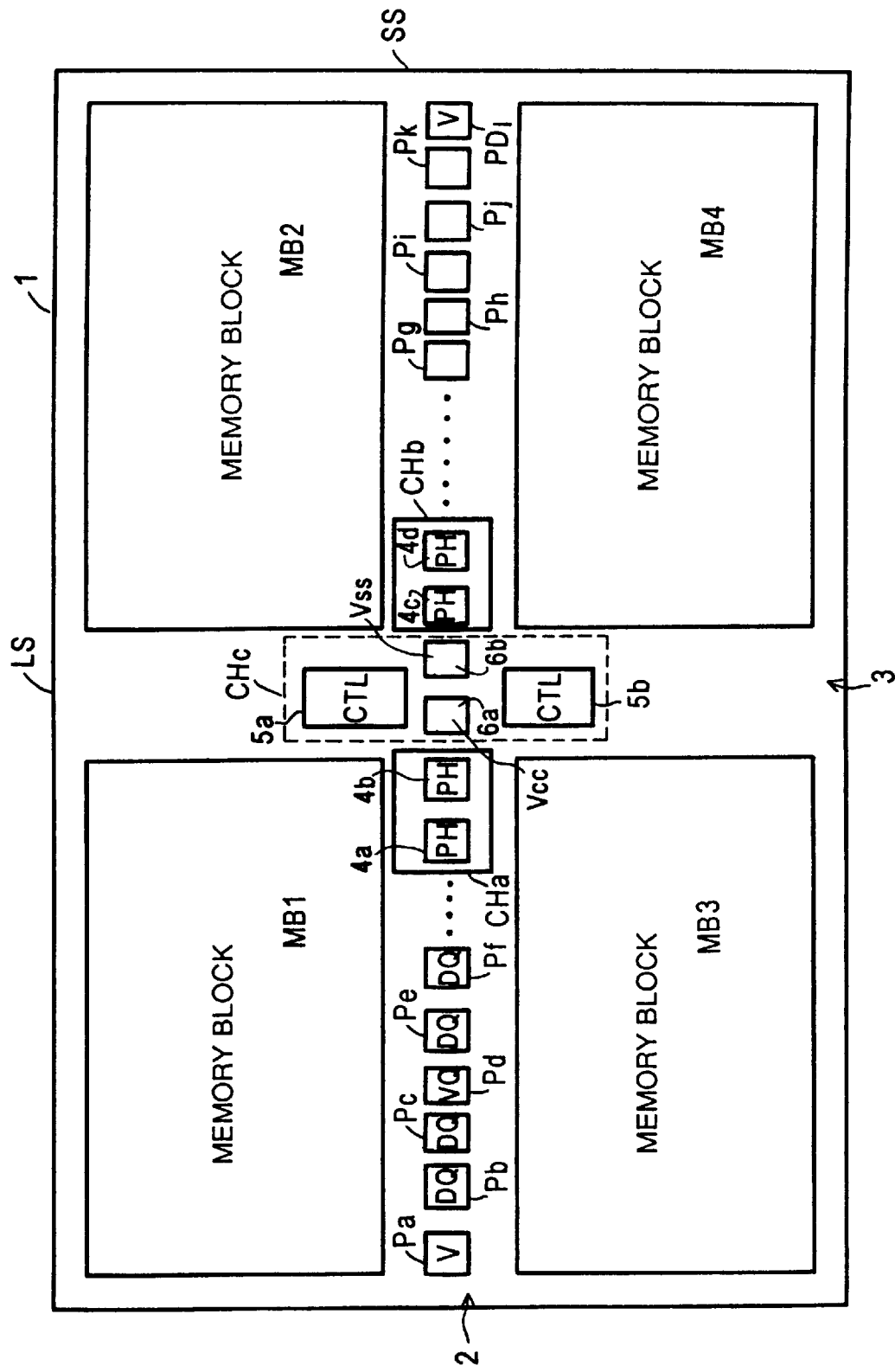
FIG. 2 shows an example of an internal arrangement of a base chip of the semiconductor memory device shown in FIG. 1.

FIG. 2 schematically shows arrangement of pads in a base chip. A structure of ×8 bits is shown in FIG. 2 as an example. Referring to FIG. 2, pads are alignedly arranged in a line only in first central region 2 of semiconductor chip 1. Pads Pb, Pc, Pe, Pf, Pg, Ph, Pj and Pk are data input/output pads. Pads Pa, Pd, Pi and Pl are power supply pad portions transmitting operation power supply voltage Vcc and ground voltage Vss. The operation power supply voltage applied to pads Pa and Pl may be used only for data input/output. Alternatively, the operation power supply voltage may be supplied from pads Pa and Pl to the memory blocks arranged in the vicinity thereof.

Pads for peripheral regions are arranged in the central portion of first central region 2 (near the portion crossing with the second central region). More specifically, peripheral circuit regions CHa, CHb and CHc are provided in the peripheral regions. Peripheral circuit region CHa is shown including peripheral pads 4a and 4b, and peripheral circuit region CHb is shown including peripheral pads 4c and 4d. The number of pads included in peripheral circuit regions CHa and CHb shown in FIG. 2 is merely an example, and the number is determined as needed. In peripheral circuit region CHc provided in second central region 3, a power supply pad 6a and a ground pad 6b are arranged in the central portion thereof and control circuits 5a and 5b are arranged symmetrically with respect to these pads. Control circuits 5a and 5b generate required control signals to memory blocks MB1–MB4 in accordance with input signals (a clock control signal and an address signal) applied from peripheral circuit regions CHa and CHb. A peripheral control circuit can be disposed in peripheral circuit regions CHa and CHb. By arranging a control circuit portion as a peripheral circuit in the central portion of first and second central regions 2 and 3, interconnection lines to memory blocks MB1–MB4 can be shortened, thereby reducing signal propagation delay and allowing high-speed operation of the semiconductor memory device.

By arranging such peripheral circuit and control circuit at the central portion, layout of interconnections to memory blocks MB1–MB4 becomes substantially symmetrical, so that each interconnection can be equal in length and thus operation timings of memory blocks MB1–MB4 can be substantially the same. Data input/output pads Pb, Pc, Pe and Pf are arranged as close to the center of memory blocks MB1 and MB3 as possible. Data input/output pads Pa, Ph, Pj and Pk are also arranged at positions close to the center of memory blocks MB2 and MB4 with respect to the direction of the longer side. As a result, difference in length between data input/output pads and internal data lines for reading out selected memory cell data, which difference arises from the difference in position of the selected memory cells in memory blocks MB1–MB4, can be made as small as possible, so that time required for input/output of the memory cell data can be made equal. As a result, there is no need to consider the worst case in setting access time, thereby allowing a high-speed access. Therefore, by arranging the peripheral control circuits in a cross at the central region of the semiconductor chip, the bonding wire portion can be shortened because of the characteristic feature of the LOC structure, that is, the bonding wire portion overlapping a region on semiconductor chip 1, thereby enhancing packing efficiency of the package. In addition, since a control signal and an address signal for controlling the peripheral circuit can be located at the central portion of the second central region of semiconductor chip 1, high-speed access and stable operations can be achieved by arranging the peripheral control circuits in the shape of a cross in the central region of semiconductor chip 1.

Now, development is made using a semiconductor memory device with the pad arrangement shown in FIG. 2 as a base chip. Upon multiple bit expansion, pads are added in second central region 3 as shown in FIG. 1. The pads alignedly arranged in first central region 2 are mainly employed for data input/output (note that power supply pad portions are arranged as desired). Similarly, pads for receiving the control signal and the address signal for peripheral control are alignedly arranged in a line at the second central region, so that a multiple-bit chip can be easily developed without changing layout of the circuits in peripheral circuit regions CHa, CHb and CHc (the width thereof may possibly be increased due to the pad arrangement). Here, the pads in the first central region may be assigned different functions to cope with the increase in the number of data input/output bits.

The pitch between pads is not changed at all. The same applies to the pads arranged in second central region 3.

As described above, in accordance with the first embodiment of the present invention, pads are arranged in a cross shape on semiconductor chip 1, so that a multi-bit chip can be easily implemented without changing the pad pitch or significantly increasing the length of the longer side of the semiconductor chip upon multibit expansion of the base chip.

Embodiment 2

Figure 3:
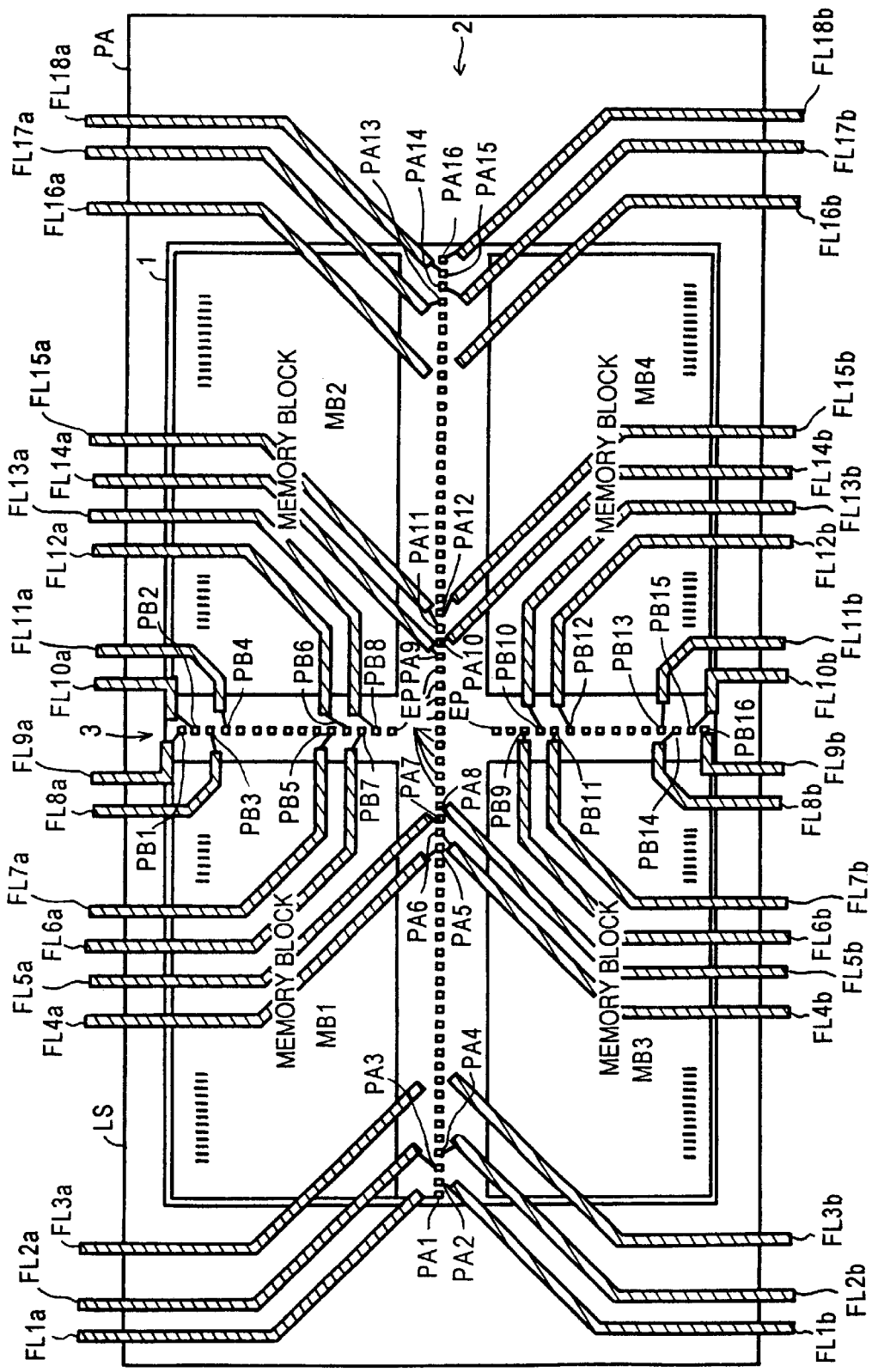
FIG. 3 shows an internal arrangement of pads and frame leads of a semiconductor memory device according to a second embodiment of the present invention.

FIG. 3 shows internal pad and lead arrangements of a semiconductor memory device according to a second embodiment of the present invention. In FIG. 3, pads PA1–PA16 are alignedly arranged in a line at first central region 2 of semiconductor chip 1, and pads PB1–PB16 are alignedly arranged in a line in second central region 3 thereof. Along one side of the longer sides of chip 1 external pin terminals on one side of package PA are arranged. Since these external pin terminals continuously extend to frame leads, they are indicated as frame leads FL1a–FL18a in FIG. 3. On the other side of the longer sides of semiconductor chip 1, frame leads FL1b–FL18b are arranged serving as external pin terminals on the other side of package PA. These leads FL1a–FL5a and FL1b–FL5b and FL13a–FL18a and FL13b–FL18b each have one end connected through a bonding wire to a predetermined corresponding pad arranged in first central region 2 (to which a lead is connected is determined in accordance with pin arrangement).

Frame leads FL6a–FL13a and FL5b–FL13b serving as the external pin terminals arranged on one and the other sides of package PA are connected to bonding pads PB1–PB16 arranged in second central region 3.

In connecting the frame leads and the bonding pads shown in FIG. 3, respective frame leads located from the central portion toward an end portion of the chip longer side are sequentially connected to the bonding pads in the second central region from the outermost pad toward the innermost one thereat.

More specifically, frame leads FL9a is connected to bonding pad PB1 arranged outermost in the second central region of semiconductor chip 1, and frame lead FL10a located in the central portion is connected to the next outermost bonding pad PB2. Frame leads FL8a and FL11a next closest to the central portion of package PA are connected respectively to bonding pads PB3 and PB4 in the second region next closest to the chip outer periphery portion. Thus, the frame leads and the bonding pads arranged in the second region are successively connected starting at the centermost frame lead. Finally, bonding pads PB5, PB6, PB7 and PB8 are connected to frame leads FL7a, FL12a, FL6a and FL13a, respectively. On the other side of semiconductor chip 1 as well, frame leads FL9b and FL10b located close to the central portion in the direction of the longer side are connected respectively to bonding pads PB16 and PB15 arranged close to the outer chip periphery portion in second central region 3. Next, frame leads FL8b and FL11b are connected to bonding pads PB14 and PB13, respectively. Finally, frame leads FL7b, FL12b, FL6b and FL13b are connected to bonding pads PB12, PB11, PB10 and PB9 in the second central region 3, respectively.

Such connection is not made that frame leads arranged in the order starting from the one as the external pin terminal closest to the central portion of the longer side of the package PA are sequentially and respectively connected to the pads arranged in the order starting from the outermost pad, so that the pitch between frame leads is twice as great as the pitch between pads (adjacent frame leads are connected to every other pad). Consequently, the pitch between frame leads is relaxed and multibit expansion can be carried out maintaining the condition of the pitch between pads alignedly arranged in a line in the first central region. In the first central region as well, adjacent lead frames have the pitch twice as great as the pitch between pads (the lead frames extending to the external pin terminals opposite to each other are alternately connected to successive bonding pads). Therefore, as shown in FIG. 3, the frame leads are connected to the bonding pads successively in the manner that the frame leads close to the center on one and the other sides of the longer sides of package PA are connected to the outermost pads of the second central region and so on, so that there is a great margin for the frame leads or the external pin terminals thus arranged. Furthermore, since the pads are arranged in the shape of a cross in the first and second central regions 2 and 3 on semiconductor chip 1, the pitch between pads need not be reduced as well, so that a semiconductor memory device capable of accommodating multibit expansion can be easily implemented.

In FIG. 3, a bonding pad EP shown in the broken line is an unused or reserved bonding pad.

As described above, in accordance with the structure of the second embodiment of the present invention, the frame leads and the bonding pads are arranged in the manner that the frame leads extending to the external pin terminals arranged in the order starting from the one at the central portion of one and the other longer sides of the semiconductor chip are connected to the bonding pads in the order starting from the one at the second central region closest to the outer periphery portion, there is no need to reduce the pitch between frame leads or external pin terminals, giving a great margin for the arranged frame leads (external pin terminals), thereby easily implementing multibit expansion.

Third Embodiment

Figure 4:
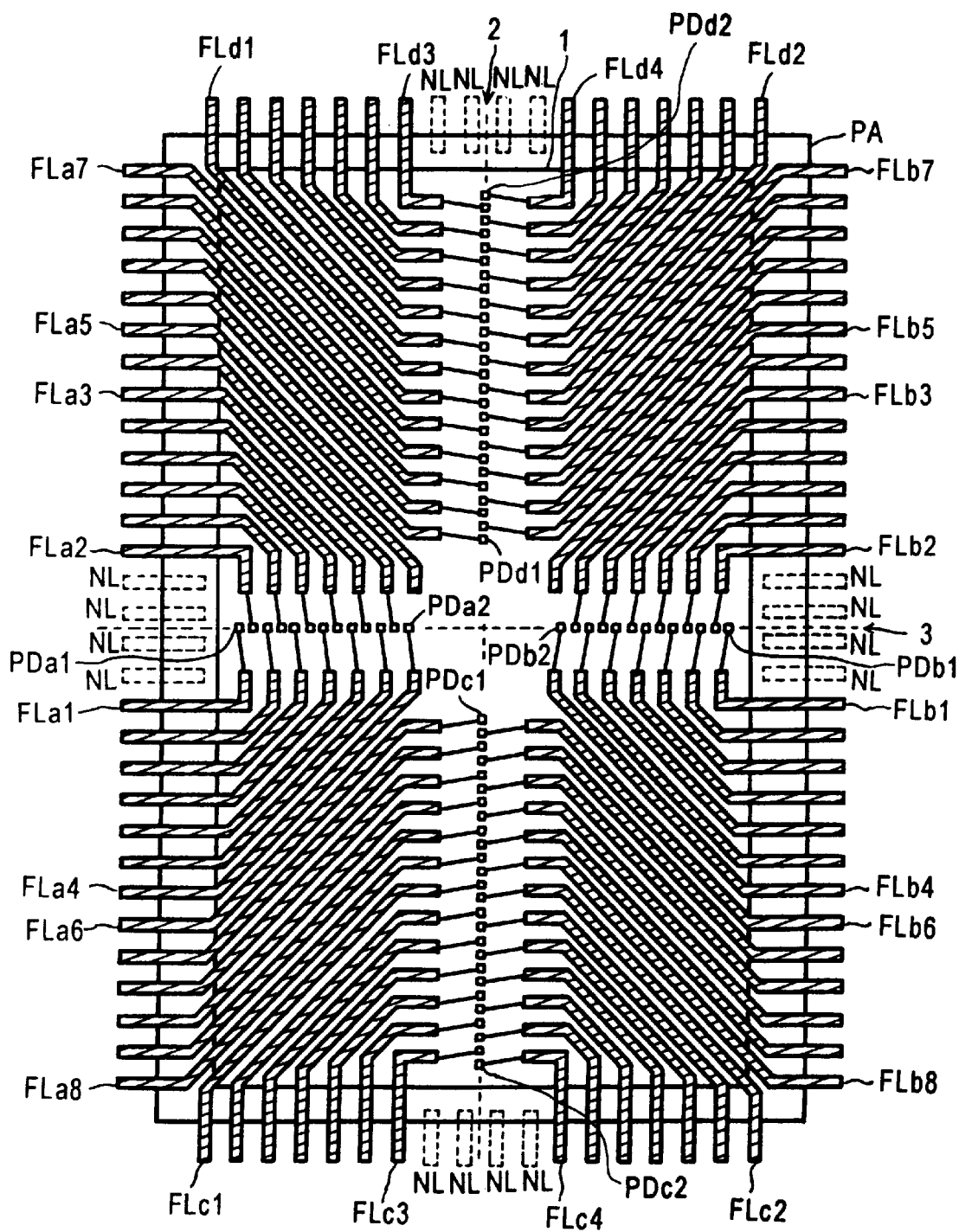
FIG. 4 shows an internal arrangement of pads and frame leads of a semiconductor memory device according to a third embodiment of the present invention.

FIG. 4 shows arrangement of lead frames according to a third embodiment of the present invention. Referring to FIG. 4, pads PD for achieving electrical connection to the chip outside are arranged in first and second central regions 2 and 3 of semiconductor chip 1.

The frame leads are provided on the semiconductor chip such that the portions thereof coupled to the external pin terminals are arranged along the shorter sides and the longer sides of the chip. In other words, the pin arrangement of the so-called QFP (Quad Flat Package) is realized in this package PA. More specifically, along one longer side of semiconductor chip 1, frame leads FLa1–FLa8 are arranged extending to the external lead terminals. Among frame leads FLa1–FLa8, the frame leads arranged at the central portion are connected to pads PDa1–PDa2 arranged in second central region 3. More specifically, frame lead FLa1 is connected to pad PDa1 provided at the outer periphery portion of semiconductor chip 1, and the upper frame lead FLa2 is connected to the next pad. The frame leads arranged on the lower and the upper sides with respect to second central region 3 are alternately connected to pads PDa1–PDa2. Pads PDa1–PDa2 are successively connected to frame leads FLa1, FLa2–FLa3 and FLa4. Similarly along the other longer side of semiconductor chip 1, frame leads FLb1 and FLb2 and such are successively connected to pads PDb1–PDb2 arranged in second central region 3. By alternately connecting the frame leads which are arranged on the upper and lower sides with respect to second central region 3, pads PDb1–PDb2 are successively connected to frame leads FLb1, FLb2–FLb3 and FLb4.

Regarding the shorter side of semiconductor chip 1 as well, the frame leads are successively connected to the pads arranged in the second central region beginning with the frame leads closed to central region 2. More specifically, along one (upper) shorter side of semiconductor chip 1, frame leads starting from FLd4 and FLd3 are connected to the pads from pas PDd2 toward the inner portion of the chip.

After frame leads FLd2 and FLd1 at both ends of the shorter side are connected to the pads, the rest of the pads in the central region 2 are connected to the frame leads FLa7 and FLb7 to FLa5 and FLb5 arranged along the longer sides (the frame leads extending to the external pin terminals arranged along the longer sides). Thus, in the connection between the frame leads and the pads, the frame leads arranged on both sides with respect to first central region 2 are alternately connected to the pads arranged in first central region 2. Subsequently, the pads arranged in first central region 2 are alternately connected to the frame leads extending to the external pin terminals arranged along both longer sides.

Connection between the frame leads along the other shorter side and the pads arranged in first central region 2 is achieved in a similar manner, beginning at frame leads FLc4 and FLc3 arranged at the central portion of the shorter side and ending at frame leads FLc2 and FLc1 arranged along the shorter side. After the frame leads arranged along the shorter side are all connected, frame leads FLb8, FLa8–FLb6 and FLa6 are successively connected to the pads in the first central region 2. Thus, pads PDc1–PDc2 are connected to the corresponding frame leads.

In accordance with the arrangement of the frame leads and the external pin terminals shown in FIG. 4, the pitch between the frame leads in the vicinity of the pads is relaxed in the directions of both shorter side and the longer side (this is because the frame leads are provided on both the longer side and the shorter side). By thus arranging the external pin terminals utilizing all the sides, the pitch between the external pin terminals can be significantly relaxed as compared with a case where only the longer sides are utilized. As a result, multibit expansion can be carried out without reducing the pitch between the external pin terminals and an increase in size of the package can also be suppressed. Thanks to such a suppression, mounting density of a board can be increased because the area occupied by the package is small when it is mounted on the board or the like.

As described above, in accordance with the third embodiment of the present invention, since the frame leads are disposed by utilizing all the longer and shorter sides, increase in size of the package and the chip can be suppressed without reducing pitches between pin terminals and between frame leads.

In FIG. 4, a block NL shown in the broken line at each central portion of the shorter and longer sides of semiconductor chip 1 (package PA) shows that no frame lead extends in this region.

Fourth Embodiment

As described previously with reference to FIGS. 1 and 2, the pads for data input/output are preferentially arranged in the first central region of the semiconductor chip, and the pads for receiving a control signal and an address signal are preferentially arranged in the second central region thereof. As described with reference to FIG. 2, peripheral circuits are arranged at the central portion of the first and second central regions. Therefore, the control signal and the address signal can be transmitted to a peripheral control circuit over a short interconnection line by arranging pads for the control signal and the address signal in the second central region, similarly to the case where the pads for receiving the control signal and the address signal are arranged at the central portion of the first central region. Such manner of arrangement will be described below with reference to FIG. 5.

Figure 5:
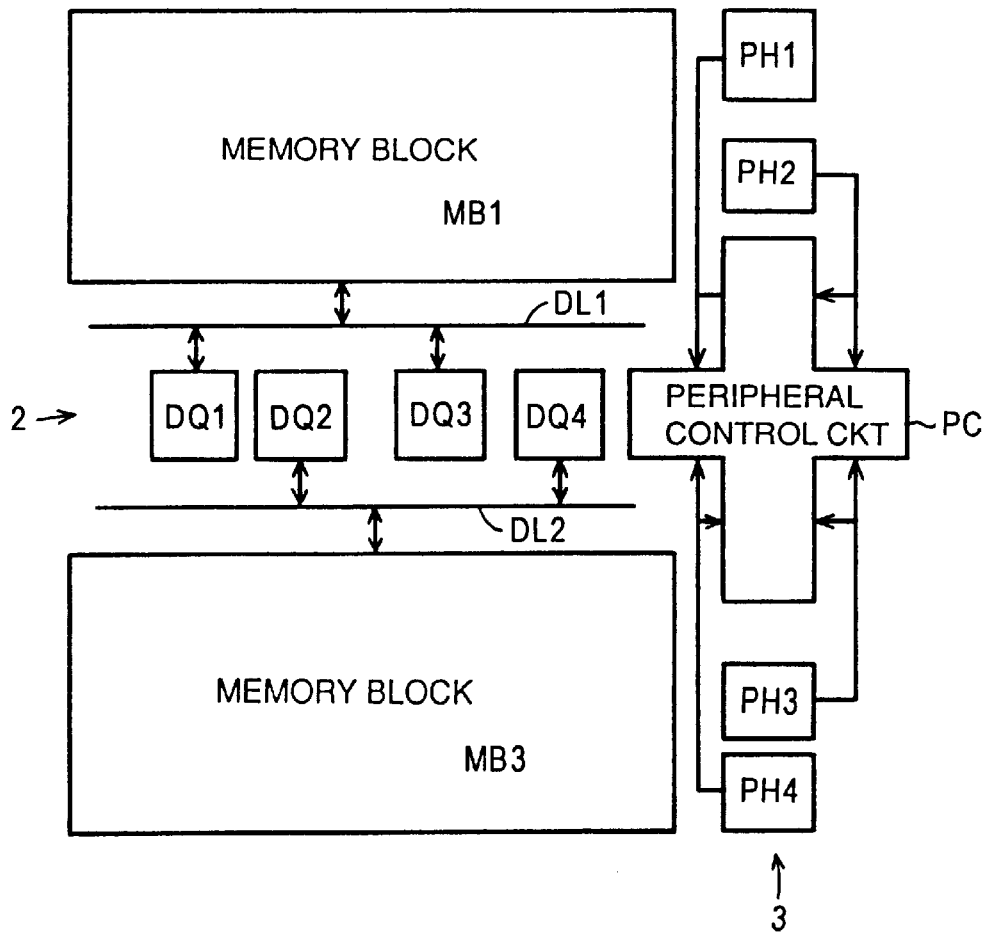
FIG. 5 shows an internal arrangement of a semiconductor memory device according to a fourth embodiment of the present invention.

FIG. 5 shows an example in which four data input and output pad portions DQ1–DQ4 are arranged in first central region 2 between two memory blocks MB1 and MB3 and peripheral pad portions PH1–PH4 are arranged in second central region 3 adjacent to memory blocks MB1 and MB3. At the central portion of first and second central regions 2 and 3, peripheral control circuit PC is arranged in a cross shape. Here, a "pad portion" indicates a structure including a pad and a buffer connected thereto. In first central region 2, pad portions DQ1 and DQ3 send and receive data to and from memory block MB1 through a data transmission line DL1, while data input and output pad portions DQ2 and DQ4 send and receive data to and from memory block MB3 through a data transmission line DL2. The data input and output pad portions are arranged corresponding to memory blocks MB1 and MB3 adjacent thereto, so that data transmission lines DL1 and DL2 can be reduced in length and data of a selected memory cell can be transmitted to the corresponding data input and output pad portion at a high speed. In addition, the following advantages can be obtained by arranging data input and output pad portions DQ1–DQ4 as close as possible to the central portion of the longer side of the corresponding memory blocks MB1 and MB3.

In general, "partial activation" arrangement is adopted in memory blocks MB1 and MB3 in a DRAM. According to the "partial activation" arrangement, memory blocks MB1 and MB3 are each divided into a plurality of subarrays, and only the subarray including a selected memory cell is activated. If, for example, the subarray arranged at the central portion of memory block MB1 is selected, data transmission and reception with the data input and output pad portion is performed at the central portion thereof through the data transmission line. If the subarray at the left end of memory block MB1 is selected, the left end portion of memory block MB1 sends/receives data to/from the data input and output pad portion through data transmission line DL1. Therefore, if data input and output pad portion DQ1 sends/receives data to/from the subarrays on the left half of memory block MB1 and data input and output pad portion DQ3 sends/receives data to/from the subarrays on the right half of memory block MB1, the difference in length of data propagation paths between the data input and output pad portion and the selected memory cell, arising from the difference in position of the selected subarrays, can be reduced.

Data input and output pad portions DQ1 and DQ3 are arranged symmetrically with respect to the central portion (in the direction of the longer side) of memory block MB1, so that time required for transmission and reception of data between data input and output pad portions DQ1 and DQ3 and memory block MB1 can be made substantially equal. The same applies to memory block MB3. Consequently, if data input and output pad portions DQ1 and DQ3 are arranged symmetrically with respect to the central portion (in the direction of the longer side) of memory block MB1, the time when valid data is obtained at data input and output pad portions DQ1 and DQ3 can be made substantially equal, thereby sufficiently reducing the difference in valid data decision timing between data input and output pad portions. Since data transmission lines DL1 and DL2 are provided only over the entire length of the longer sides of the corresponding memory blocks MB1 and MB3, interconnection capacitance and resistance thereof can be reduced and signal propagation delay can be decreased, thereby allowing high speed access.

Peripheral pad portions PH1–PH4 are arranged in the second central region. They are arranged symmetrically with respect to peripheral control circuit PC and adjacent thereto, whereby a signal applied to peripheral control circuit PC can be transmitted through the shortest interconnection with substantially the same length. Accordingly, the address signal and the control signal can be decided more quickly, and peripheral control circuit PC can initiate its operation more quickly.

Since peripheral pad portions PH1–PH4 are arranged symmetrically with respect to peripheral control circuit PC, the decision timings of signals output from peripheral pad portions PH1–PH4 are substantially the same and therefore internal decision timings of address signals will be the same, thereby reducing "address skew", advancing the timing to initiate internal operations and allowing high speed access.

Figure 6:
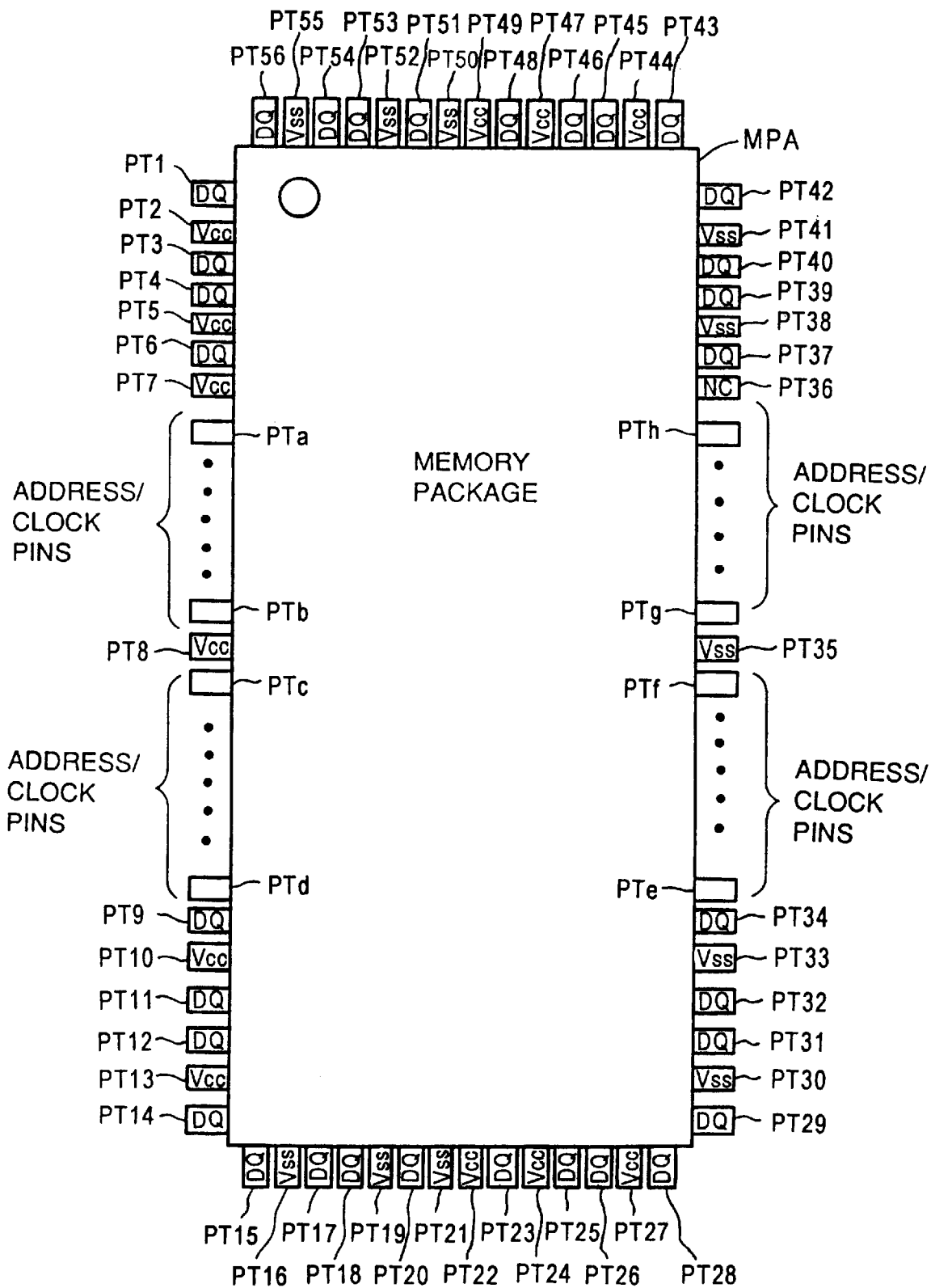
FIG. 6 shows an arrangement of external pin terminals of a package for accommodating the semiconductor memory device according to the fourth embodiment of the present invention.

FIG. 6 shows an arrangement of external pin terminals of a semiconductor memory device with pad arrangement according to a fourth embodiment of the present invention. The package shown in FIG. 6 has the structure of a QFP package. The internal lead arrangement corresponding to the package shown in FIG. 6 corresponds to the arrangement shown in FIG. 4.

Referring to FIG. 6, along one longer side of a package MPA, data input/output pin terminals PT1, PT3, PT4 and PT6 are arranged at one end, and data input/output pint terminals PT9, PT11, PT12 and PT14 are arranged at the other end. Power supply pin terminals are arranged between data input/output pin terminals. More specifically, a power supply pin terminal PT2 receiving power supply voltage Vcc is provided between data pin terminals PT1 and PT3, and a power supply pin terminal PT5 is provided between data pin terminals PT4 and PT6. A power supply pin terminal PT7 is provided adjacent to data pin terminal PT6. At the other end as well, a power supply pin terminal PT10 is provided between data pin terminals PT9 and PT11, and a power supply pin terminal PT13 is provided between data pin terminals PT12 and PT14. A power supply pin terminal PT8 is provided at the central portion of the longer side of the package. Address/clock pin terminals (hereinafter referred to as peripheral pin terminals) PTa–PTb receiving an address signal or a clock signal (control signal) are arranged between pin terminals PT7 and PT8, and peripheral pin terminals PTc–PTd are provided between pin terminals PT8 and PT9.

Along the other longer side of memory package MPA, data pin terminals PT42, PT40, PT39 and PT37 are provided at one end, and data pin terminals PT34, PT32, PT31 and PT29 are arranged at the other end. A ground pin terminal PT41 receiving ground voltage Vss is provided between data pin terminals PT42 and PT40, and a ground pin terminal PT38 is provided between data pin terminals PT39 and PT37. A pin terminal PT36 is a non-connected (No Connection: NC) pin terminal and is not connected to a pad inside. It is provided only to keep constant the internal pad arrangement and the pitch between the pins defined by an external specification. Pin terminal PT36 can be used as a ground pin terminal or as a pin terminal for receiving another signal. A ground pin terminal PT33 is provided between data pin terminals PT34 and PT32, and a ground pin terminal PT30 is provided between data pin terminals PT31 and PT29. Peripheral pin terminals PTh–PTg are provided between pin terminals PT36 and PT35, and peripheral pin terminals PTf–PTe are provided between pin terminals PT35 and PT34.

Along one shorter side of memory package MPA, data pin terminals PT56, PT54, PT53, PT51, PT48, PT46, PT45 and PT43 are arranged. A ground pin terminal PT55 is arranged between pin terminals PT56 and PT54, and a ground pin terminal PT52 are arranged between pin terminals PT53 and PT51. Ground pin terminals PT50 and power supply pin terminal PT49 are arranged between pin terminals PT51 and PT48. A power supply pin terminal PT47 is arranged between data pin terminals PT48 and PT46, and a power supply terminal PT44 is arranged between data pin terminals PT45 and PT43.

Along the other shorter side of memory package MPA, data pin terminals PT15, PT17, PT18, PT20, PT23, PT25, PT26 and PT28 are provided. A ground pin terminal PT16 is provided between data pin terminals PT15 and PT17, and a ground pin terminal PT19 is provided between pin terminals PT18 and PT20. A ground pin terminal PT21 and a power supply pin terminal PT22 are provided between data pin terminals PT20 and PT23. A power supply pin terminal PT24 is provided between data pin terminals PT23 and PT25, and a power supply pin terminal PT27 is provided between data pin terminals PT26 and PT28.

Power supply pin terminal PT8 and ground pin terminal PT35 provided at the central portion of the longer sides of memory package MPA apply a power supply voltage and a ground voltage for operating the peripheral circuit. Power supply pin terminals and ground pin terminals provided between data pin terminals can be dedicated to data input/output buffers or can be used for operations of the corresponding memory blocks. The same applies to power supply pin terminals and ground pin terminals arranged along the shorter sides of memory package MPA. By thus arranging power supply/ground pin terminals between data pin terminals, the power supply voltage can be supplied to data input/output buffers in a stable manner.

External pin terminals PT1–PT56 shown in FIG. 6 are coupled to the frame leads shown in FIG. 4. Therefore, wiring between the frame leads and the bonding pads can be easily implemented as shown in FIG. 4 by utilizing the external pin arrangement shown in FIG. 6.

As described above, in accordance with the structure of the fourth embodiment, since peripheral pin terminals for receiving an address signal and a control signal are arranged near the central portion of the longer side of the package and data input/output pin terminals are arranged at both ends of the longer sides and along the shorter sides, so that the structure, in which the pads for data input/output are arranged in first central region and the pads for receiving the address signal and the clock signal are arranged in the second central region, can be realized without any complicated wiring, thereby minimizing a signal propagation path from the pad to a corresponding internal circuit. Since the arrangement is substantially symmetrical, the propagation time of each signal can be made substantially the same. As a result, a semiconductor device performing high-speed and stable operations can be implemented.

Fifth Embodiment

Figure 7:
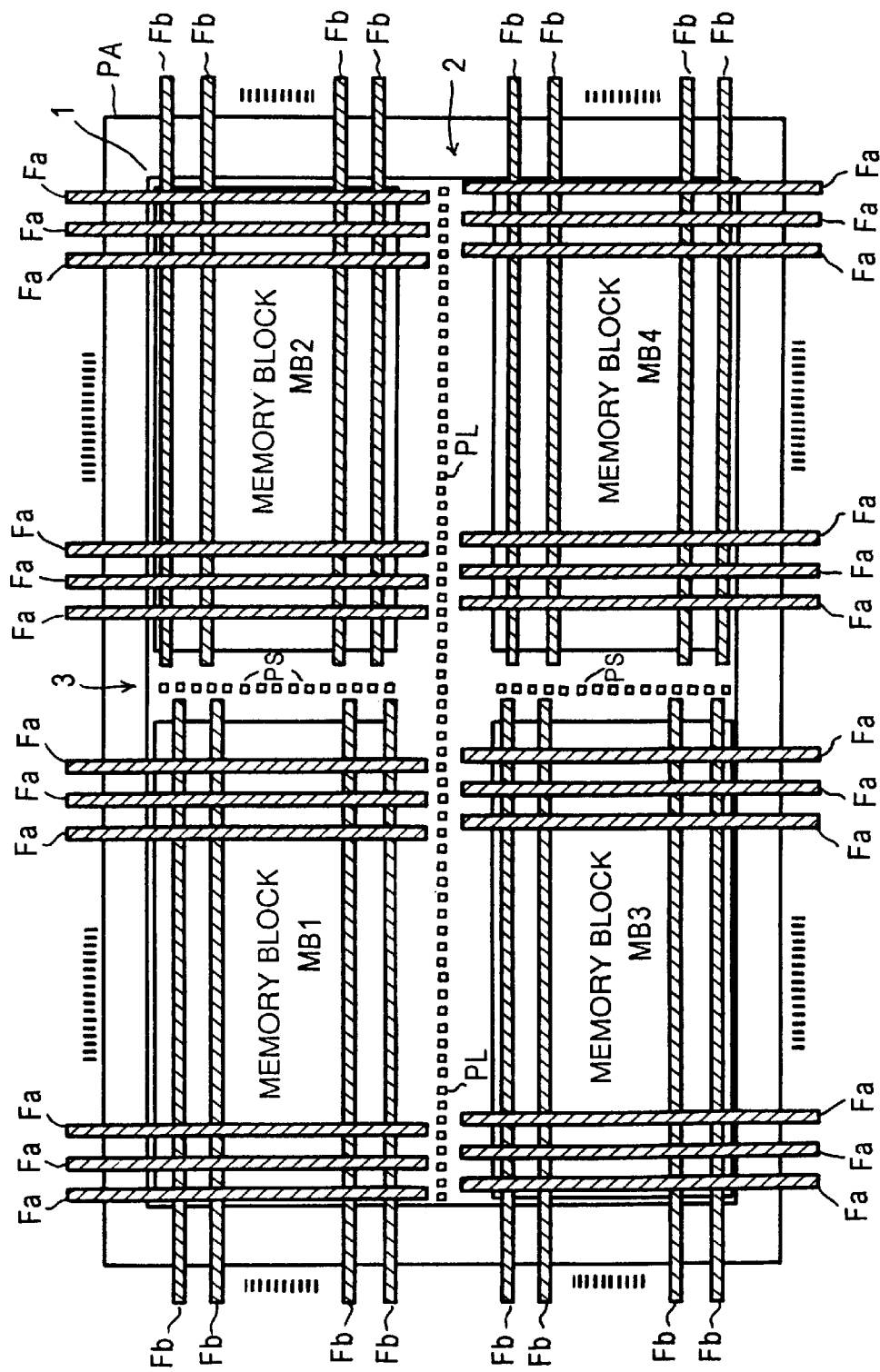
FIG. 7 shows an internal arrangement of a semiconductor memory device according to a fifth embodiment of the present invention.

FIG. 7 shows arrangement of leads according to a fifth embodiment of the present invention. In the structure shown in FIG. 7, pads PL and PS are alignedly arranged in a line respectively in first and second central regions 2 and 3 of semiconductor chip 1, similarly to the embodiments described above. Corresponding to pads PL provided in first central region 2, frame leads Fa extending in the direction of the shorter side on chip 1 and provided at a layer different from frame leads Fb are arranged and connected to the corresponding ones of pads PL.

Corresponding to pads PS arranged in second central region 3, frame leads Fb are provided extending on chip 1 in the direction of the longer side of chip 1. Frame leads Fb are connected to the corresponding ones of pads PS provided in second central region 3.

Pads PL provided in first central region 2 are connected only to the frame leads coupled to the external pin terminals arranged along the longer side of semiconductor chip 1 (or package PA). Similarly, only the frame leads connected to pads PS arranged in second central region 3 are disposed along the shorter side of semiconductor chip 1 (or package PA). There is no need to provide frame leads on the longer side corresponding to the pads in both the first and second central regions, thereby relaxing the pitch between frame leads. Furthermore, the connection between pads and frame leads does not require a rule such as a rule in which the frame leads extending to the external pin terminals arranged closer to the central portion of the longer side of the chip are connected to the pads arranged at the outer portions of second central region 3. Since the pitch conditions of frame leads are relaxed, frame leads and corresponding pads are connected more flexibly, and signals can be assigned more freely to the pads and the external pin terminals. For example, if pads PS arranged in second central region 3 are used for applying an address signal and a peripheral control signal, the external pin terminals arranged along the shorter side of semiconductor chip 1 (package PA) are assigned a control signal and an address signal (including power supply pins). In such a case, data pin terminals for data input/output are arranged as the external pin terminals arranged along the longer side of package PA. Alternatively, among the frame leads arranged along the longer side of semiconductor chip 1 (package PA), the frame leads arranged at the central portion (the portion close to the second central region) can be used for communication with the address signal or the control signal.

In the arrangement shown in FIG. 7, the frame leads are arranged extending in a line in the direction of the longer side or the shorter side. They may have a bending portion for changing the position in the region on semiconductor chip 1 (see the frame leads at both end portions of the longer side of the chip shown in FIG. 3, for example).

Figure 8A:
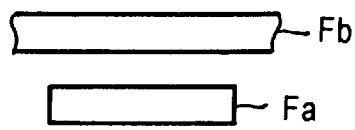
FIGS. 8A and 8B schematically show cross sectional structures of the frame leads shown in FIG. 7.
Figure 8B:
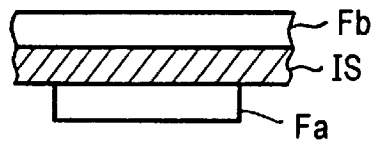

FIGS. 8A and 8B show cross sectional structures of two-layered frame leads. FIGS. 8A and 8B show only one frame lead for each of the first and second layers. Referring to FIG. 8A, frame lead Fb extending along the longer side is disposed over frame lead Fa extending along the shorter side. There is a hollow region between frame leads Fa and Fb. Since a frame lead is supported by the frame (metal frame) which is not shown, the frame leads in different layers are prevented from contacting each other even in such a hollow structure. The frame leads are sealed with resin when contained in the package, causing no problem in use. Since the frame lead extends substantially straightly, offset in the position of the lead can be prevented even in the hollow frame lead structure with no support element, so that accuracy in positioning can be improved and frame lead pitch margin can be reduced. In addition, contact between adjacent frame leads at the bending portion for change in position can be prevented, offering reliability of the device.

Alternatively, insulation material IS is interposed between frame lead Fa in the first layer and frame lead Fb in the second layer as shown in FIG. 8B. A tape of polymeric organic material such as the one used in TAB (Tape Automated Bonding) technology can be employed as insulation material IS.

Although frame lead Fa extending along the shorter side is shown being formed in the first layer in FIGS. 8A and 8B, frame lead Fb extending along the longer side can alternatively be formed in the first layer.

As described above, in accordance with the structure of the fifth embodiment of the present invention, the frame leads have a multi-layered structure, so that the pitch conditions of frame leads can be relaxed and/or freedom in frame interconnection is increased, thereby relaxing the limitation on signal assignment to pins and pads.

Sixth Embodiment

Figure 9:
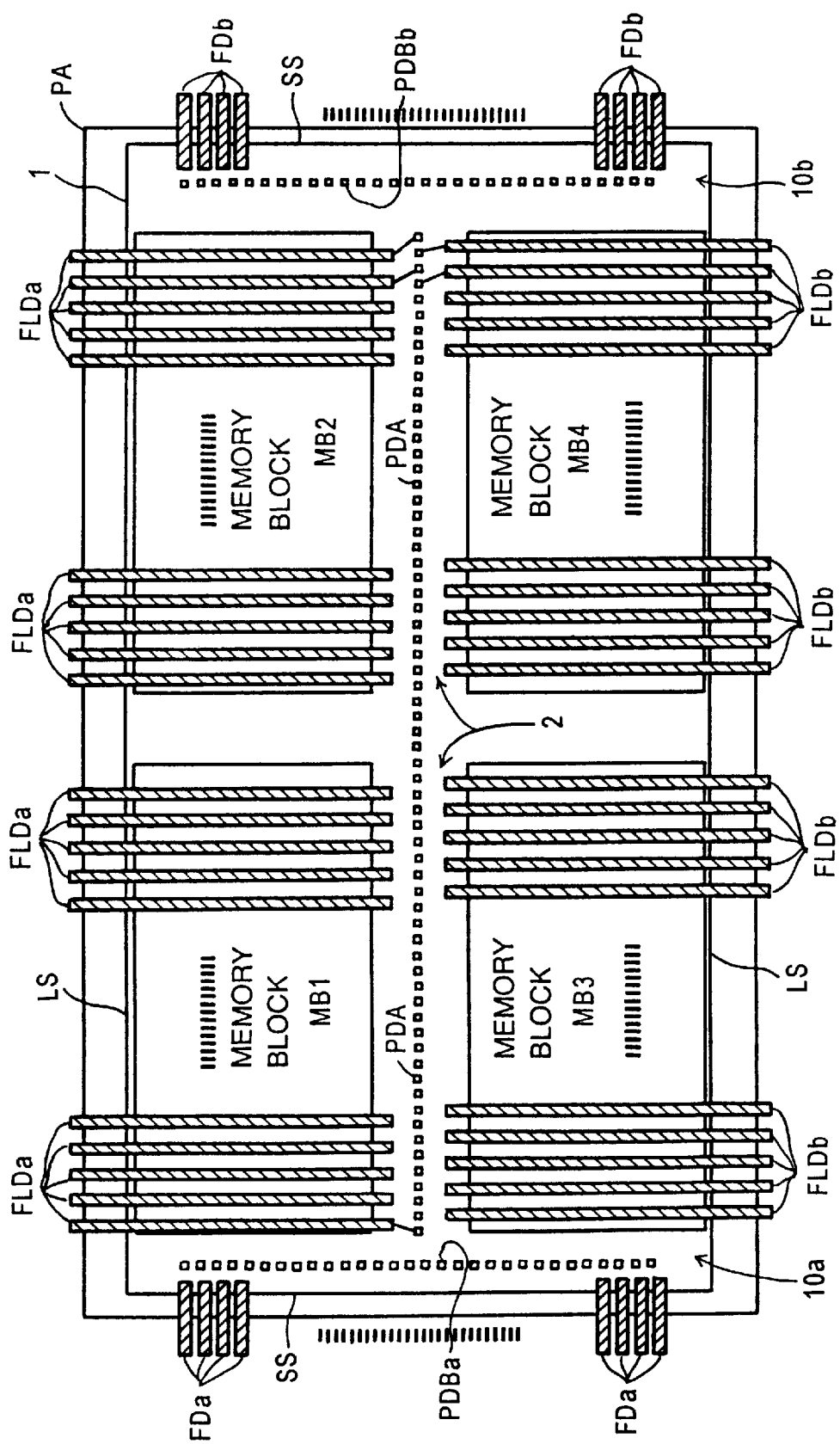
FIG. 9 schematically shows an internal arrangement of the semiconductor memory device according to a sixth embodiment of the present invention.

FIG. 9 shows arrangement of pads and frame leads of a semiconductor memory device according to a sixth embodiment of the present invention. Description will be made first of the pad arrangement.

[Pad Arrangement]

Referring to FIG. 9, pads PDA are alignedly arranged in first central region 2 of semiconductor chip 1. Pads PDBa and PDBb are arranged in peripheral regions 10a and 10b along shorter sides SS at both ends of longer side LS of semiconductor chip 1. Since pads are arranged in peripheral regions 10a and 10b as well as first central region 2 along the longer side, pads can be additionally arranged in peripheral regions 10a and 10b in multiple bit expansion. As a result, an increase in length of the longer side of semiconductor chip 1 can be suppressed in multibit expansion. There is no need to reduce pitch between pads even though the number of pads is increased, so that the number of pads can be increased easily. In the base chip, pads PDA are arranged only in first central region 2 for development of products. Upon multibit expansion, pads are additionally arranged in peripheral regions 10a and 10b. In such a development, a structure can be utilized in which the pads for data input/output are preferentially arranged in the first central region and the pads for the address signal and the control signal are preferentially arranged in peripheral regions 10a and 10b.

As described above, in accordance with the pad arrangement shown in FIG. 9, pads are arranged also in peripheral regions 10a and 10b along the shorter sides at both ends of the longer side of semiconductor chip 1, whereby increase in length of the longer side of the chip can be suppressed in multibit expansion by additionally providing pads in peripheral regions 10a and 10b. In addition, there is no need to reduce pitch between pads arranged in first central region 2, thereby facilitating multiple bit expansion.

Furthermore, in the arrangement shown in FIG. 9, a predetermined number of pads arranged in first central region 2 and peripheral regions 10a and 10b can be used in the base chip. In such a case, pads are additionally provided in first central region 2 and peripheral regions 10a and 10b in multibit expansion.

[Lead Arrangement]

As shown in FIG. 9, pads PDA arranged in first central region 2 are connected to frame leads FLDa and FLDb which extend to be the external pin terminals arranged along the longer side of semiconductor chip 1 (or package PA). Frame leads FLDa and FLDb extend on semiconductor chip 1 to the first central region and have the LOC structure.

In contrast, pads PDBa and PDBb arranged in peripheral regions 10a and 10b are connected to frame leads FDa and FDb which extend to the external pin terminals arranged along the shorter sides, respectively. Frame leads FDa and FDb need not extend over semiconductor chip 1, and they are connected to the pads arranged at the peripheral portion of semiconductor chip. Therefore, frame leads FDa and FDb need not have the LOC structure.

When the structure of frame lead arrangement and pin arrangement of the package shown in FIG. 9 is adopted the semiconductor memory device is contained in a QFP package. However, the pads arranged in first central region 2 are connected only to frame leads FLDa and FLDb extending in the direction of the shorter side. Frame leads FLDa and FLDb do not have a bending portion (see FIG. 3, for example) on semiconductor chip 1 to change its position. They extend almost straightly. Therefore, even if LOC frame leads are formed of the hollow frame leads without supporting members, offset in position can be prevented and reduction in margin of the pitch between frame leads can be obtained. In addition, contact between adjacent frame leads at the bending portion can be prevented. Thus, reliability of the device is enhanced. Since frame leads are disposed corresponding to the external pin terminals arranged along all of the four sides of semiconductor chip 1 (or package PA), there is no need to reduce the pitch between pin terminals or between frame leads, thereby suppressing increase in size of the package in the direction of the longer side.

As described above, in accordance with the arrangement of frame leads shown in FIG. 9, the pads arranged in the first central region are connected to the frame leads which in turn extend to be the external pin terminals arranged along the longer side of package PA, and the pads arranged in the peripheral region are connected to the frame leads which in turn extend to be the external pin terminals arranged along the shorter side of package PA, so that an increase in size of the package can be suppressed in multibit expansion without reducing the pitch between pins or the pitch between frame leads.

Seventh Embodiment

Figure 10:
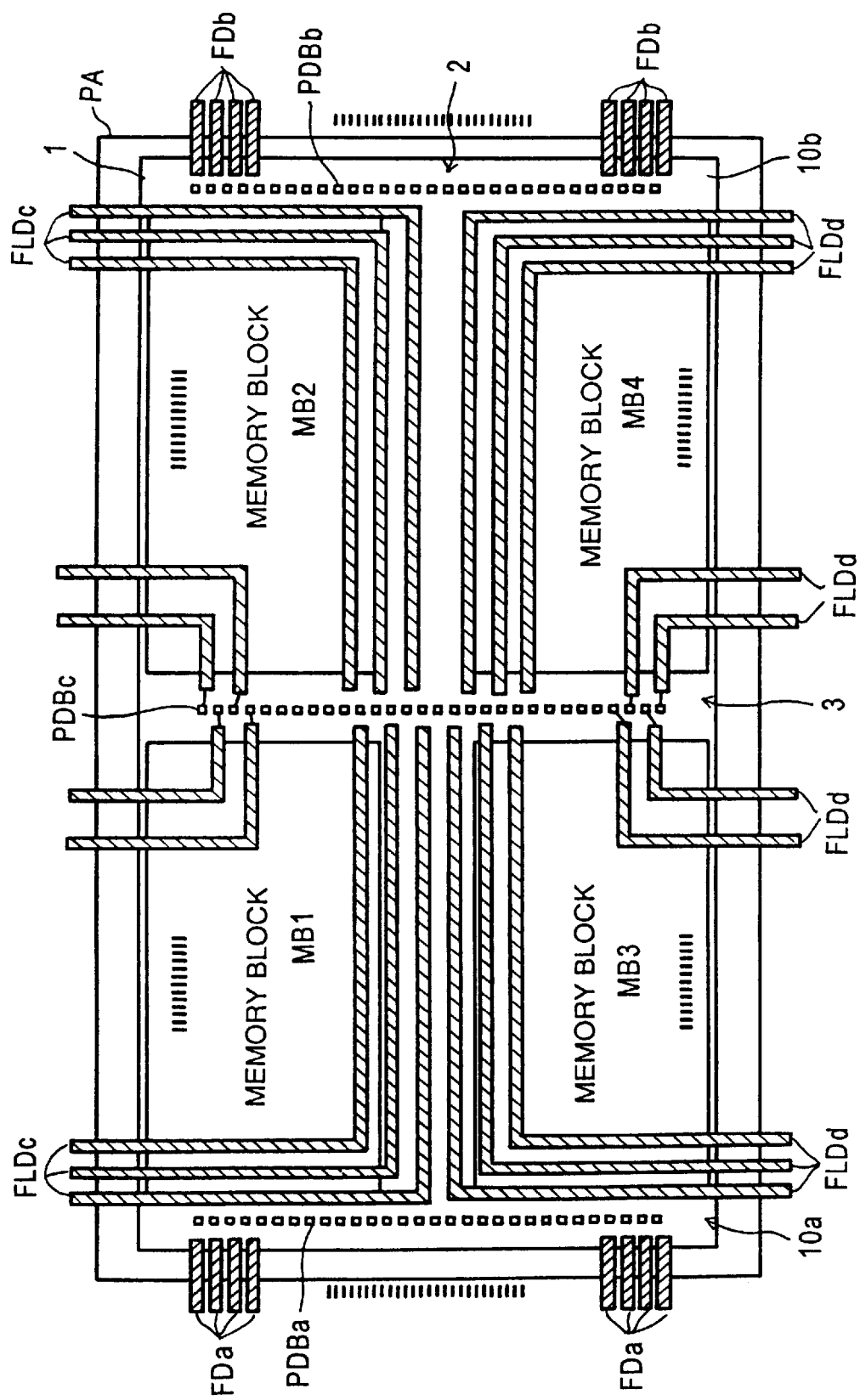
FIG. 10 shows an internal arrangement of a semiconductor memory device according to a seventh embodiment of the present invention.
Figure 11:
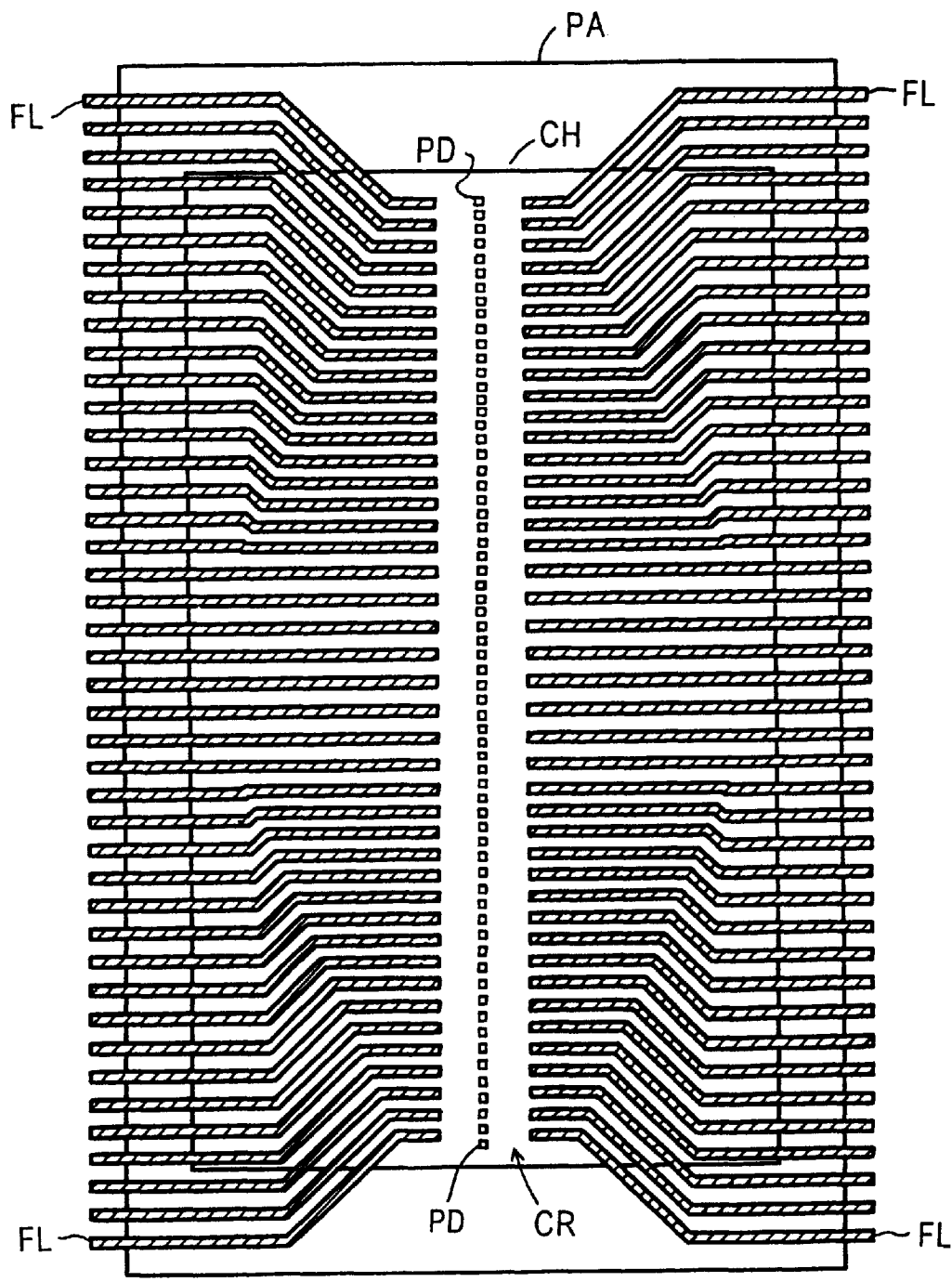
FIG. 11 shows an internal arrangement of a conventional semiconductor memory device.

FIG. 10 shows internal arrangement of a semiconductor memory device according to a seventh embodiment of the present invention. Description will be made hereinafter of pad arrangement and frame lead arrangement.

[Pad Arrangement]

Referring to FIG. 10, in the seventh embodiment, pads PDBc and PDBa and PDBb are arranged in second central region 3 and peripheral regions 10a and 10b along the shorter sides at both ends of the longer side LS on semiconductor chip 1, respectively. No pad is arranged along the longer side in first central region 2, whereby increase in length of the shorter side caused by arrangement of the pads in first central region 2 can be suppressed. As a result, an advantageous pad arrangement can be achieved when restrictions on the length of the shorter side of package PA or semiconductor chip 1 are strict.

Since pads PDBa, PDBb and PDBc are arranged only along the shorter side and no pad is arranged along the longer side upon multibit expansion, increase in length of the longer side of semiconductor chip 1 can be suppressed in multibit expansion. The pitch between pads need not be reduced in this case as well.

Multibit expansion can be carried out by adopting, for example, the following method. The base chip is developed by providing only the pads PDBc in second central region 3. Upon multibit expansion, pads are additionally provided in peripheral regions 10a and 10b at both ends of the longer side. Alternatively, a base chip is developed with pads PDBc, PDBa and PDBb arranged in regions 3, 10a and 10b, respectively, and the pads are additionally provided in respective regions, for multibit expansion. In either case, multibit expansion can be easily carried out by a simple method of additional arrangement of pads. In this pad arrangement, data input/output pads can be preferentially arranged in peripheral regions 10a and 10b in the base chip or upon multibit expansion. In such a case, the pads for receiving the control signal and the address signal are preferentially arranged in second central region 3.

As described above, in the pad arrangement in accordance with the seventh embodiment, pads are arranged only in the region along the shorter side of the semiconductor chip, so that the area occupied by the pads in the first central region along the longer side can be reduced and increase in length of the shorter side of semiconductor chip 1 can be suppressed. Since pads are arranged along the shorter side in multibit expansion as well, increase in length of the longer side of semiconductor chip 1 can be suppressed without reducing the pitch between pads. Change in position of the pads can be easily made in multibit expansion by merely adding the pads along the shorter side.

[Frame Lead Arrangement]

Pads PDBc arranged in second central region 3 are sequentially to frame leads FLDc and FLDd which in turn extend to be the external pin terminals arranged along the longer side of semiconductor chip 1, as shown in FIG. 10. Frame leads FLDc and FLDd and pads PDBc are sequentially connected so that a frame lead located closer to the central portion of the longer side is connected to a pad more distant from the center in second central region 3. As a result, complicated connection of bonding wires can be suppressed and wiring between the frame leads and the bonding pads can be achieved easily. These frame leads FLDc and FLDd have the LOC structure. In accordance with the connection in which a frame lead located closer to the central portion takes precedence in connection with a pad located closer to the outermost portion in the second central region, unnecessary arrangement of external pin terminals along the longer side of package PA can be prevented and increase in length of the longer side of the package can be suppressed. Since frame leads FLDc and FLDd connected to the external pin terminals arranged along the longer side are connected to pads PDBc arranged along the shorter side, the conditions of the pitch between external pin terminals can be relaxed, giving a great margin in arrangement of frame leads.

Pads PDBa and PDBb arranged in peripheral regions 10a and 10b are connected respectively to frame leads FDa and FDb extending to be the external pin terminals arranged along the shorter side of package PA. Frame leads FDa and FDb need not have the LOC structure. In assigning signals to the frame leads, the input/output data signal can be assigned to frame leads FDa and FDb connected to pads at peripheral regions 10a and 10b.

In accordance with the arrangement of the frame leads shown in FIG. 10, the frame leads extending to be the external pin terminals arranged along the longer side of the package are connected to the pads alignedly arranged along the shorter side of semiconductor chip 1, so that the conditions of the pitch between pin terminals arranged along the longer side can be relaxed. Similarly, the pitch condition of frame leads FLDc and FLDd arranged along the longer side can also be relaxed.

As described above, in accordance with the present invention, increase in size of the semiconductor chip and the package can be suppressed upon multibit expansion without reducing the pitch between pads and the pitch between pin terminals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An individual semiconductor memory device formed on a single semiconductor chip, comprising:

a first line of a plurality of first pads and a second line of a plurality of second pads arranged in a shape of a cross on the semiconductor chip, each of the first and second pads provided for implementing an electrical connection with an external device; and a plurality of leads extending over said semiconductor chip and corresponding respectively to external lead terminals that are provided along four sides of said semiconductor chip, each of the leads having a first end at one of said four sides and a second end connected to a predetermined corresponding pad of said first and second pads, the first ends of the plurality of leads arranged along the four sides of the semiconductor chip and connectable to the corresponding external lead terminals.

2. A semiconductor memory device formed on a single semiconductor chip, comprising:

a first line of a plurality of first pads and a line of a plurality of second pads arranged in a shape of a cross on the semiconductor chip, each of the first and second pads provided for implementing an electrical connection with an external device, wherein said plurality of first pads include pads for input and output of data, and said plurality of second pads include pads for receiving a control signal and an address signal applied externally.

3. The semiconductor memory device according to claim 2, wherein said single semiconductor chip has four sides and further comprises a plurality of leads arranged thereon to couple the first and second pads to external lead terminals arranged along the respective four sides.

4. An individual semiconductor memory device formed on a single semiconductor chip, comprising:

a first line of a plurality of first pads and a line of a plurality of second pads arranged in a shape of a cross on the semiconductor chip, each of the first and second pads provided for implementing an electrical connection with an external device; and a plurality of leads disposed over said semiconductor chip and corresponding to external lead terminals provided along four sides of said semiconductor chip, each of the leads having a first end provided at one of said four sides and a second end connected to a predetermined corresponding pad of said first and second pads, wherein a first lead having its first end located at a central portion of a first side of the four sides is connected to one of said second pads, and a second lead having its first end located at an end remote from the central portion of said first side is connected to one of said first pads, and a third lead having its first end located on a second side of the four sides perpendicular to said first side is connected to one of said first pads.

5. An individual semiconductor memory device formed on a single semiconductor chip having four sides, comprising:

a first line of a plurality of pads and a second line of a plurality of pads arranged in a shape of a cross on the semiconductor chip, each of the plurality of pads provided for implementing an electrical connection with an external device; and a plurality of leads disposed over said semiconductor chip and corresponding to external lead terminals provided along four sides of the semiconductor chip, each of the leads having a first end provided on one of the four sides of said semiconductor chip and a second end connected to a predetermined corresponding one of said pads with each of the four sides having at least two ends of said plurality of leads, wherein leads having each respective first end located at a central portion at each side of said four sides are connected to predetermined corresponding pads in one respective line of said first and second lines, so that respective leads located from said central portion to an end portion of a respective side of the semiconductor chip are sequentially connected to said corresponding pads in an order from an outermost pad towards an innermost pad in said one respective line.

6. An individual semiconductor memory device formed on a single semiconductor chip, comprising:

a first line of a plurality of first pads and a second line of a plurality of second pads arranged in a shape of a cross on the semiconductor chip, each of the first and second pads provided for implementing an electrical connection with an external device;

a plurality of first leads extending along a first side of said semiconductor chip, each of the first leads connected to a predetermined corresponding pad of said plurality of second pads; and a plurality of second leads disposed in a layer different from that of said plurality of first leads, extending along a second side perpendicular to said first side, each of the second leads connected to a predetermined corresponding pad of said plurality of first pads, paths of the first leads and the second leads intersecting each other in different layers.

7. An individual semiconductor memory device formed on a single semiconductor chip, comprising:

a first line of a plurality of first pads and a line of a plurality of second pads arranged in a shape of a cross on the semiconductor chip, each of the first and second pads provided for implementing an electrical connection with an external device, said cross shape dividing the semiconductor chip into four portions; and a plurality of memory blocks arranged on said four portions, wherein said semiconductor chip has a first side parallel to the line of said plurality of first pads, and a second side parallel to the line of said plurality of second pads, and wherein the first pads include data input and output pads provided corresponding to the plurality of memory blocks for applying and receiving data to and from corresponding memory blocks, each of the data input and output pads provided near a center of a corresponding memory block in a direction of said first side.

8. The semiconductor memory device according to claim 7, wherein said first side is longer than said second side.

9. An individual semiconductor memory device formed on a single semiconductor chip, comprising:

a first line of a plurality of first pads and a line of a plurality of second pads arranged in a shape of a cross on the semiconductor chip, each of the first and second pads provided for implementing an electrical connection with an external device, said cross shape dividing the semiconductor chip into four portions; and a plurality of memory blocks arranged on said portions, wherein said semiconductor chip has a first side parallel to the line of the first pads, and a second side parallel to the line of the second pads, and wherein the first pads include a plurality of data input and output pads of a predetermined number for each memory block, for communicating data with a corresponding memory block, and the predetermined number of data input and output pads are arranged symmetrically with respect to a center of the corresponding memory block in a direction of the first side.

10. The semiconductor memory device according to claim 9, wherein said first side is longer than said second side.

11. An individual semiconductor memory device formed on a single semiconductor chip having a rectangular shape with first sides extending in a first direction and second sides extending in a second direction substantially perpendicular to said first direction and a surface having an array of memory cells and comprising:
- a plurality of first pads for establishing an electrical connection with an external device and arranged in a first central region which is formed at a central portion with respect to the direction of said second sides and extending substantially parallel to said first sides; and
- a plurality of second pads for establishing an electrical connection with the external device and arranged at both end portions of said first sides along said second sides.

12. The semiconductor memory device according to claim 11, further comprising:
- a plurality of first leads arranged corresponding to external lead terminals arranged along the first side of said semiconductor chip, extending over said chip in the direction of said second side, and connected to predetermined corresponding first pads of said plurality of first pads; and
- a plurality of second leads arranged corresponding to external lead terminals arranged along said second side and connected to predetermined corresponding second pads of said plurality of second pads.

13. The individual semiconductor memory device according to claim 11, wherein said plurality of first pads includes a pad for communication data with the external device.

14. The individual semiconductor memory device according to claim 11, wherein said first central region is arranged between first and second memory blocks included in said array and coupled to predetermined first and second pads of the first and second pads.

15. The individual semiconductor memory device according to claim 11, wherein said plurality of second pads are uniformly arranged in a line.

16. The individual semiconductor memory device according to claim 11, wherein the first and second pads are connected to external lead terminals that are arranged along four sides of said single semiconductor chip.

17. An individual semiconductor memory device formed on a single semiconductor chip having a rectangular shape with first and second sides having respective directions of extension substantially perpendicular to each other and having at least an array of memory cells formed thereon, comprising:
- a plurality of pads for establishing an electrical connection with an external device and arranged in a direction of extension of said second side in a central region with respect to a direction of said first side on the semiconductor chip and on peripheral regions of said semiconductor chip at both ends of said first side, the pads in said central region being substantially uniformly arranged in a line extending between the opposing first sides.

18. The semiconductor memory device according to claim 13, further comprising a plurality of leads coupled to external pin terminals arranged along said first side and each connected to a predetermined corresponding pad of the pads in said central region.

19. A device as recited in claim 17, wherein the number of pads in said central region is substantially the same as the number of pads in the peripheral region at each end of the first side.

* * * * *